United States Patent
Misev (12)

(10) Patent No.: US 6,235,807 B1
(45) Date of Patent: May 22, 2001

(54) CURING PROCESS FOR CATIONICALLY PHOTOCURABLE FORMULATIONS

(75) Inventor: Ljubomir Misev, Breitenbach (CH)

(73) Assignee: Ciba Specialty Chemicals Corporation, Tarrytown, NY (US)

( * ) Notice: Subject to any disclaimer, the term of this patent is extended or adjusted under 35 U.S.C. 154(b) by 0 days.

(21) Appl. No.: 09/202,355

(22) PCT Filed: Jul. 1, 1997

(86) PCT No.: PCT/EP97/03430

§ 371 Date: Dec. 14, 1998

§ 102(e) Date: Dec. 14, 1998

(87) PCT Pub. No.: WO98/02493

PCT Pub. Date: Jan. 22, 1998

(30) Foreign Application Priority Data

Jul. 12, 1996 (EP) .................................................. 96810459

(51) Int. Cl.⁷ .................................. C08F 2/48; C08J 7/18
(52) U.S. Cl. .................................. 522/15; 522/16; 522/25; 522/28; 522/53; 522/68; 522/71; 522/75; 522/74; 522/81; 522/100; 522/170; 522/168; 427/514; 427/516; 427/517; 427/508
(58) Field of Search .................................. 522/31, 81, 100, 522/170, 168, 514, 75, 71, 74, 15, 16, 25, 28, 53, 68; 427/517, 514, 516

(56) References Cited

U.S. PATENT DOCUMENTS

| 4,026,705 | * | 5/1977 | Crivello et al. | 430/280.1 |
|---|---|---|---|---|
| 4,090,936 | * | 5/1978 | Barton | 430/280.1 |
| 4,113,895 | * | 9/1978 | Watt et al. | 427/514 |
| 4,318,766 | * | 3/1982 | Smith | 156/330 |
| 4,374,963 | | 2/1983 | Morgan et al. | 525/486 |
| 4,548,890 | * | 10/1985 | Dickinson et al. | 430/280.1 |
| 4,593,052 | * | 6/1986 | Irving | 522/31 |
| 4,659,649 | | 4/1987 | Dickinson et al. | 430/280 |
| 4,835,193 | * | 5/1989 | Hayase et al. | 522/15 |
| 4,840,977 | | 6/1989 | Crivello et al. | 522/25 |
| 5,086,086 | * | 2/1992 | Brown-Wensley et al. | 522/25 |
| 5,318,808 | * | 6/1994 | Crivello et al. | 427/517 |
| 5,516,813 | * | 5/1996 | Starkey | 522/25 |
| 5,547,713 | | 8/1996 | Alvarado | 427/493 |
| 5,667,856 | * | 9/1997 | Kamen et al. | 428/34.6 |
| 5,668,192 | | 9/1997 | Castellanos et al. | 552/31 |
| 5,721,020 | * | 2/1998 | Takami et al. | 427/508 |

FOREIGN PATENT DOCUMENTS

| 0082602 | 6/1983 | (EP) . |
|---|---|---|
| 0334056 | 9/1989 | (EP) . |
| 0445791 | 9/1991 | (EP) . |
| 0667381 | 8/1995 | (EP) . |

OTHER PUBLICATIONS

Carroy, Radtech Europe '95, pp. 523–530, (1995).
Carroy, Radtech North America '94, pp. 462–471, (1994)
Donhowe, Radtech North America '94, pp. 10–20, (1994).
Derwent Abstr. 95–276637/37 for EP 667381.
Derwent Abstr 88–023922 for JP 62283121.

\* cited by examiner

*Primary Examiner*—James J. Seidleck
*Assistant Examiner*—Sanza L. McClendon
(74) *Attorney, Agent, or Firm*—Tyler A. Stevenson; Luther A. R. Hall

(57) ABSTRACT

A curing process for cationically polymerisable monomers, which comprises applying a composition comprising: (a) at least one cationically polymerisable monomer, (b) as photoinitiator at least one iodonium salt containing an $SbF_6$, $PF_6$ or $BF_4$ anion, (c) one pigment, and (d) at least one sensitiser, to a substrate, irradiating it with light having a wavelength of 200–600 nm and then heat-postcuring it, is distinguished by little yellowing of the cured formulation.

17 Claims, No Drawings

CURING PROCESS FOR CATIONICALLY PHOTOCURABLE FORMULATIONS

The present invention relates to a process for curing cationically polymerisable compounds.

In the case of cationically photocurable formulations which are subjected to additional thermal demands in the course of processing, e.g. by heat postcuring and the like, the photocured layer often yellows. This is not desirable, in particular not in white-pigmented formulations.

Surprisingly, it has now been found that the use of specific photoinitiators for cationically curing the UV-curable layers results in a bleaching effect during heating instead of yellowing, effectively suppressing the undesirable discolouration of the cured layer. In addition, the layers cured in this manner have good curing properties.

Daryliodonium salts are known as catalysts for photochemically induced cationic polymerisations. EP-A 334 056, for example, discloses a coating process in which non-toxic diaryl-iodonium salts are used as photoinitiators for a cationically curable unpigmented composition based on epoxy resins.

EP-A 562 897 uses "onium" salts with (pentafluorophenyl)borate anions as photocuring agents in an unpigmented composition.

In Radtech Europe 95, A. Carroy describes the photocuring of, inter alia, pigmented systems. The chain transfer rate of the polymerisation was dependent on the type of anion. Accordingly, iodonium salt initiators containing specific anions, in particular tetrakis(penta-fluorophenyl)borate anions, as contrasted to customary sulfonium salt initiators containing e.g. $SbF_6$ anions, were suitable for curing pigmented systems. The performance of these compounds is further increased by the addition of sensitiser compounds such as thioxan-thones.

In RadTech North America '94, A. Carroy investigates the cationic photocuring of compositions having a very high $TiO_2$ content, using sulfonium salt compounds or iodonium salt compounds as initiators. The result shows that, without sensitising, none of the compounds give satisfactory results whereas very good curing results are obtained by sensitising additionally with thioxanthone or anthracene derivatives when using iodonium salt.

In RadTech North America '94, E. Donhowe describes a coating process for aluminium cans. In this instance, an ink and a radically or cationically polymerisable overvarnish is first applied to the external side of the can and cured with UV radiation. The internal side of the can is then coated with a heat-curing coating and is subsequently heat cured.

EP-A 667 381, EP-A 082 602 and U.S. Pat. No. 4,374, 963 describe UV-crosslinkable epoxy resin compositions.

Coating substrates with, in particular, white radiation-curable formulations often results in a darkening or yellowing of the coated surfaces. Formulations are required wherein such effects are kept as low as possible or do not occur at all.

Surprisingly, it has now been found that when using specific iodonium salt photoinitiators containing $SbF_6$ or $PF_6$ anions in combination with sensitiser compounds in photocurable, in particular white-pigmented, formulations, these formulations do not show any yellowing during curing and subsequent heating, a bleaching of the formulation or coating taking place instead.

Accordingly, this invention relates to a curing process for cationically polymerisable resins, wherein
a composition comprising
  (a) at least one cationically polymerisable compound,
  (b) as photoinitiator at least one iodonium salt containing an $SbF_6$, $PF_6$ or $BF_4$ anion,
  (c) one pigment, and
  (d) at least one sensitiser,
is applied to a substrate and is irradiated with light having a wavelength of 200–600 nm, which process comprises heat-treating the composition after the exposure to light, thereby producing a bleaching of the formulation.

This invention also relates to the use of a combination consisting of at least one iodonium salt containing an $SbF_6$, $PF_6$ or $BF_4$ anion as photoinitiator and at least one sensitiser for curing and concommittantly bleaching pigmented cationically polymerisable compositions.

Compositions for the novel curing process comprise resins and compounds (as component (a)) which can be cationically polymerised using alkyl- or aryl-containing cations or protons. Typical examples are cyclic ethers, preferably epoxides, as well as vinyl ether and hydroxyl-containing compounds.

All customary epoxides may be used, such as aromatic, aliphatic or cycloaliphatic epoxy resins. These are compounds having at least one, preferably at least two, epoxy groups in the molecule. Typical examples are the glycidyl ethers and β-methylglycidyl ethers of aliphatic or cycloaliphatic diols or polyols, e.g. those of ethylene glycol, propane-1,2-diol, propane-1,3-diol, butane-,4-diol, diethylene glycol, polyethylene glycol, polypropylene glycol, glycerol, trimethylolpropane or 1,4-dimethylolcyclohexane, or of 2,2-bis(4-hydroxycyclohexyl) propane and N,N-bis(2-hydroxyethyl)aniline; the glycidyl ethers of di- and polyphenols, typically of resorcinol, of 4,4'-dihydroxyphenyl-2,2-propane, of novolaks or of 1,1,2,2-tetrakis(4-hydroxyphenyl)ethane. Illustrative examples are phenyl glycidyl ether, p-tert-butyl glycidyl ether, o-icresyl glycidyl ether, polytetrahydrofuran glycidyl ether, n-butyl glycidyl ether, 2-ethylhexyl glycidyl ether, $C_{12/15}$alkyl glycidyl ether, cyclohexanedimethanol diglycidyl ether. Other examples are N-glycidyl compounds, typically the glycidyl compounds of ethylene urea, 1,3-propylene urea or 5-dimethylhydantoin or of 4,4'-methylene-5,5'-tetramethyidi-hydantoin, or e.g. triglycidyl isocyanurate.

Other technically important glycidyl compounds are the glycidyl esters of carboxylic acid, preferably di- and polycarboxylic acids. Typical examples are the glycidyl esters of succinic acid, adipic acid, azelaic acid, sebacic acid, phthalic acid, terephthalic acid, tetra- and hexa-hydrophthalic acid, isophthalic acid or trimellitic acid, or of dimerised fatty acids.

Illustrative examples of polyepoxides which are not glycidyl compounds are the epoxides of vinyl cyclohexane and dicyclopentadiene, 3-(3', 4'-epoxicyclohexyl)-8,9-epoxy-2, 4-dioxa- spiro [5.5]undecane, of the 3', 4'-epoxycyclohexylmethyl ester of 3,4-epoxycyclohexane carboxylic acid, butadiene diepoxide or isoprene diepoxide, epoxidised linolic acid derivatives or epoxidised polybutadiene.

Other suitable epoxy resins are, for example, epoxy resins of bisphenol A and bisphenol F, e.g. Araldit® GY 250 (A), Araldit® GY 282 (F), Araldit® GY 285 (F) (supplied by Ciba Specialty Chemicals).

Further suitable cationically polymerisable components (a) can also be found, inter alia, in U.S. Pat. No. 4 299 938 and 4 339 567.

Of the group of the aliphatic epoxides, the monofunctional a-olefin epoxides having an unbranched chain consisting of 10, 12, 14 and 16 carbon atoms are particularly suitable.

As a large number of different epoxy resins is commercially available today, it is possible to substantially vary the properties of the binder in accordance with the curing process of this invention. Another possibility for variation consists in using mixtures of different epoxy resins and also in the addition of flexibilisers and reactive thinners.

To facilitate their application, the epoxy resins may be diluted with a solvent, for example when the application is carried out by spraying. Preferably, however, the epoxy resin is used in solvent-free state. Resins that are viscous to solid at room temperature can be applied hot.

All customary vinyl ethers may be used, such as aromatic, aliphatic or cycloaliphatic vinyl ethers. These are compounds having at least one, preferably at least two, vinyl ether groups in the molecule. Typical examples of vinyl ethers suitable for use according to this curing process are triethylene glycol divinyl ether, 1,4-cyclohexanedimethanol divinyl ether, 4hydroxybutyl vinyl ether, the propenyl ether of propylene carbonate, dodecyl vinyl ether, tert-butyl vinyl ether, tert-amyl vinyl ether, cyclohexyl vinyl ether, 2-ethylhexyl vinyl ether, ethylene glycol monovinyl ether, butanediol monovinyl ether, hexanediol monovinyl ether, 1,4-cyclohexanedimethanol monovinyl ether, diethylene glycol monovinyl ether, ethylene glycol divinyl ether, ethylene glycol butyl vinyl ether, butanediol-1,4-divinyl ether, hexanediol divinyl ether, diethylene glycol divinyl ether, triethylene glycol methyl vinyl ether, tetraethy-lene glycol divinyl ether, pluriol-E-200-divinyl ether, polytetrahydrofuran-290-divinyl ether, trimethylolpropane trivinyl ether, dipropylene glycol divinyl ether, octadecyl vinyl ether, methyl (4-cyclohexylmethyleneoxyethene) glutarate and (4-butyloxyethene)isophthalate.

Illustrative examples of hydroxyl-containing compounds are polyester polyols, such as polycaprolactones or polyester adipate polyols, glycols and polyether polyols, castor oil, hydroxyfunctional vinyl and acrylic resins, cellulose esters, such as cellulose acetate butyrate, and phenoxy resins.

Additional cationically curable formulations may be found, inter alia, in EP-A-1 19 425.

Component (a) preferably consists of cycloaliphatic epoxides, or epoxides based on bisphenol A.

A preferred process is that wherein the photoinitiator (b) is a compound of formula I or II $$[R_1-I-R_2]^+[MF_6]^- \quad (I)$$

$$[R_1-I-R_2]^+[BF_4]^- \quad (II),$$

wherein $R_1$ and $R_2$ are each independently of the other phenyl which is unsubstituted or substituted by $C_1-C_{24}$alkyl, $C_1-C_{24}$alkoxy, $NO_2$, Cl, Br, CN, $COOR_3$, $SR_3$ or

a radical

or $R_1$ and $R_2$ together are a radical

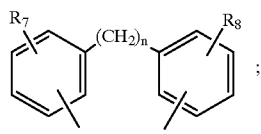

n is a number from 0 to 6;

$R_3$ is hydrogen or $C_1-C_{12}$alkyl;

$R_4$ is $C_1-C_{18}$alkyl or phenyl;

$R_5$ and $R_6$ are CN, or $R_5$ is $NO_2$, and $R_6$ is phenyl;

$R_7$ and $R_8$ are each independently of the other $C_1-C_{24}$alkyl, $C_1-C_{24}$alkoxy, $NO_2$, Cl, Br, CN, $COOR_3$, or $SR_3$; and M is P, Sb or As.

$C_1-C_{24}$Alkyl is linear or branched and is typically $C_1-C_{12}$alkyl, $C_1-C_8$alkyl, $C_1-C_6$alkyl or $C_1-C_4$-alkyl. Typical examples are methyl, ethyl, propyl, isopropyl, n-butyl, sec-butyl, isobutyl, tert-butyl, pentyl, hexyl, heptyl, 2,4,4-trimethylpentyl, 2-ethylhexyl, octyl, nonyl, decyl, undecyl, dodecyl, tetradecyl, pentadecyl, hexadecyl, heptadecyl, octadecyl, nonadecyl or icosyl. $C_1-C_{18}$Alkyl and $C_1-C_{12}$alkyl are likewise linear or branched. The meanings correspond to those cited above up to the corresponding number of carbon atoms.

$C_1-C_{24}$Alkoxy is linear or branched radicals, typically methoxy, ethoxy, propoxy, isopropoxy, n-butyloxy, sec-butyloxy, isobutyloxy, tert-butyloxy, pentyloxy, hexyloxy, heptyloxy, 2,4,4-trimethylpentyloxy, 2-ethylhexyloxy, octyloxy, nonyloxy, decyloxy, dodecyloxy or icosyloxy, in particular methoxy, ethoxy, propoxy, isopropoxy, n-butyloxy, sec-butyloxy, isobutyloxy, tert-butyloxy, octyloxy, preferably methoxy and octyloxy.

Substituted phenyl is substituted at the phenyl ring one to five times, for example one, two or three times, in particular one or two times, preferably once. Substituted phenylene is substituted at the phenyl ring one to four times, for example one, two or three times, in particular one or two times, preferably once.

$C_1-C_{30}$Alkylene and $C_1-C_{14}$alkylene are linear or branched. Typical examples are methylene, ethylene, propylene, isopropylene, n-butylene, sec-butylene, isobutylene, tert-butylene, pentylene, hexylene, heptylene, 2,4,4-trimethylpentylene, 2-ethylhexylene, octylene, nonylene, decylene, undecylene, dodecylene, tetradecylene, pentadecylene, hexadecylene, heptadecylene, octadecylene, nonadecylene or icosylene.

Preferred compounds are those of formula 1. Those compounds, wherein RI and $R_2$ are identical, are also interesting.

Other interesting compounds of formula I are also those, wherein $R_1$ and $R_2$ are each independently of the other phenyl which is unsubstituted or substituted by $C_1-C_{24}$alkyl, $C_1-C_{24}$alkoxy, $NO_2$, Cl, Br, CN, $COOR_3$ or $SR_3$.

Likewise preferred are those compounds of formula I, wherein $R_1$ and $R_2$ are $C_1-C_{24}$alkyl- or $C_1-C_{24}$alkoxy-substituted phenyl.

Compounds of formula I to be mentioned in particular are those wherein M is P.

Preferred photoinitiators are those containing $SbF_6$ or $PF_6$ anions, preferably the $PF_6$ anion.

Illustrative examples of compounds of formulae I and II are bis(4-hexylphenyl)iodonium hexafluoroantimonate;
bis(4-hexylphenyl)iodonium hexafluorophosphate;
(4-hexylphenyl)phenyliodonium hexafluoroantimonate;
(4-hexylphenyl)phenyliodonium hexafluorophosphate;
bis(4-octylphenyl)iodonium hexafluoroantimonate;
[4-(2-hydroxytetradecyloxy)phenyl]phenyliodonium hexafluoroantimonate;
[4-(2-hydroxydodecyloxy)phenyl]phenyliodonium hexafluoroantimonate;
bis(4-octylphenyl)iodonium hexafluorophosphate:
(4- octylphenyl)phenyliodonium hexafluoroantimonate;
(4-octylphenyl)phenyliodonium hexafluorophosphate;
bis(4-decylphenyl)iodonium hexafluoroantimonate;
bis(4-decylphenyl)iodonium hexafluorophosphate;
(4-decylphenyl)phenyliodonium hexafluoroantimonate;
(4-decylphenyl)phenyliodonium hexafluorophosphate;
(4-octyloxyphenyl)phenyliodonium hexafluoroantimonate;
(4-octyloxyphenyl)phenyliodonium hexafluorophosphate;
(2-hydroxydodecyloxyphenyl)phenyliodonium hexafluoroantimonate;
(2-hydroxydodecyloxyphenyl)phenyliodonium hexafluorophosphate;
bis(4-hexylphenyl)iodonium tetrafluoroborate;
(4-hexylphenyl)phenyliodonium tetrafluoroborate;
bis(4-octylphenyl)iodonium tetrafluoroborate;
(4-octylphenyl)phenyliodonium tetrafluoroborate;
bis(4-decylphenyl)iodonium tetrafluoroborate;
bis(4-(mixed $C_8$–$C_4$alkyl)phenyl)iodonium hexafluoroantimonate;
(4-decylphenyl)phenyliodonium tetrafluoroborate;
(4-octyloxyphenyl)phenyliodonium tetrafluoroborate;
(2-hydroxydodecyloxyphenyl)phenyliodonium tetrafluoroborate;
biphenylene iodonium tetrafluoroborate;
biphenylene iodonium hexafluorophosphate;
biphenylene iodonium hexafluoroantimonate.

The preparation of the photoinitiator compounds of formulae I and II is known to the skilled person and is described in the literature. The compounds of formula II may be found, inter alia, in EP-A-0 562 897.

Compounds of formula I can, for example, be prepared by the process disclosed in U.S. Pat. Nos. 4 399 071 and 4 329 300 and in DE-A 27 54 853.

In the process of this invention, the photoinitiator (b) is conveniently used in an amount of 0.05% to 15%, preferably of 0.1% to 5%, based on the composition.

In the novel process it is possible to use organic and inorganic pigments. It preferred to use white pigments, preferably titanium dioxide. The rutile modification of the titanium dioxide is particularly preferred.

Depending on their envisaged end use, the pigments are used in the novel process in an amount of 5% to 60%, e.g. 20% to 55%, preferably of 40% to 50%, based on the composition.

In the novel process, the heat aftertreatment is normally carried out at 100° C. to 2500° C., e.g. at 150° C. to 220° C., preferably at 170° C. to 210° C.

Surprisingly, heating the polymerisable composition after the irradiation step results in a bleaching of the formulation. This is not described in the prior art and was not to be foreseen from the prior art teachings.

Accordingly, the novel process gives cured formulations with little yellowing. This is particularly important in the case of white-pigmented formulations. Of course the bleaching effect also takes place in unpigmented clear systems.

The novel process can also be used for coating substrates on both sides. This process is particularly interesting to use when e.g. one side of the substrate is coated with the above-described photocurable composition and the other side is coated with a heat-curable coating. When this coating is heat-cured, the above-described bleaching effect takes place in the UV-cured layer due to the heating. This procedure is particularly interesting when coating aluminium cans. Accordingly, this invention also relates to a process for coating substrates on both sides, wherein first one surface of the substrate is coated with a UV-curable coating comprising (a) at least one cationically polymerisable compound,
(b) as photoinitiator at least one iodonium salt containing one $SbF_6$, $PF_6$ or $BF_4$ anion,
(c) one pigment, and
(d) at least one sensitiser, and then irradiated with light having a wavelength of 200–600 nm, and then a heat-curable coating is applied to the second surface which is subsequently heat cured, the heat curing at the same time producing a bleaching of the radiation-cured coating.

In the novel process the performance of the photoinitiator (b) is expediently enhanced by the addition of sensitisers.

Suitable sensitisers are, for example, compounds of the aromatic hydrocarbon class, typically anthracene and its derivatives, of the group of the xanthones, benzophenones and the derivatives thereof, such as Michier's ketone, Mannich bases or bis(p-N,N-dimethyl-aminobenzylidene) acetone. Thioxanthone and the derivatives thereof are also suitable, typically isopropylthioxanthone or dyes, such as acridines, triarylmethanes, e.g. malachite green, indolines, thiazines, e.g. methylene blue, oxazines, phenazines, typically safranine, or rhodamines. Aromatic carbonyl compounds are particularly suitable, such as benzo-phenone, thioxanthone, anthraquinone and 3-acylcuomarine derivatives, and also 3-(aroyl-methylene thiazolines, as well as eosine, rhodanine and erythrosine dyes. Preferred sensitisers are those selected of the group consisting of the anthracenes, xan-thones, benzophenones and thioxanthones, preferably isopropylthioxanthone.

Typical examples of suitable sensitisers are 2,4-diethylthioxanthone;
isopropylthioxanthone;
mixture of

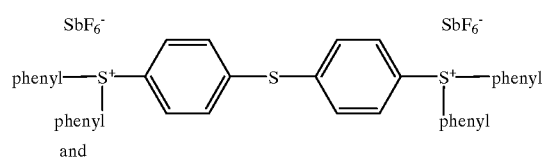

and

-continued

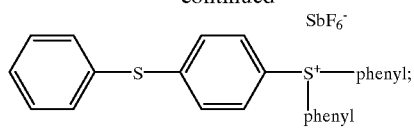

mixture of

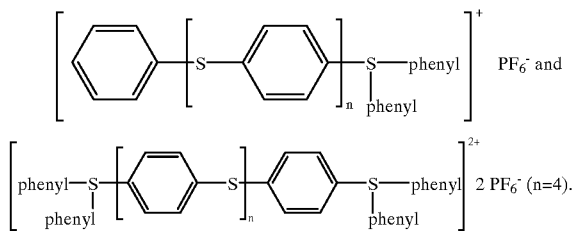

The sensitiser (d) is conveniently added to the formulation to be cured in an amount of 0.1–10% by weight, e.g. of 0.3–5% by weight, preferably of 0.5–2% by weight.

In addition to components (a), (b), (c) and (d) it is possible to add further additives in the process of this invention. Such additional additives are added to the compositions in amounts customary in the art and generally known to the skilled person. Typical examples of such additives are light stabilisers such as UV absorbers, typically those of the hydroxy-phenylbenztriazole, hydroxyphenylbenzophenone, oxalic acid amide or hydroxyphenyl-s-triazine type. These compounds may be used singly or in admixture with or without the addition of sterically hindered amines (HALS).

Other customary additives are —depending on the envisaged end use - fluorescent whitening agents, fillers, dyes, wetting agents or flow control agents.

This process can be used in a range of fields, for example for coating materials, in printing colours, clear coating formulations, white enamels, such as for wood or metals, or for paints, e.g. for paper, wood, metal or plastics.

Substrates of all kinds can be coated by the novel process, e.g. wood, textiles, paper, ceramics, glass, plastics such as polyester, polyethylene terephthalate, polyolefins or cellulose acetate, preferably in the form of films, as well as metals such as Al, Cu, Ni, Fe, Zn, Mg or Co and GaAs, Si or $SiO_2$ which are to be coated with a protective layer.

The substrates can be coated by applying a liquid formulation, a solution or suspension thereto. The choice of the solvent and the concentration depend mainly on the type of composition and on the coating process. The solvent should be inert, i.e. it should not chemically react with the components and it should be possible to remove it after coating and when drying. Suitable solvents are, for example, ketones, ethers and esters, such as methyl ethyl ketone, isobutyl methyl ketone, cyclopentanone, cyclohexanone, N-methyl-pyrrolidone, dioxane, tetrahydrofuran, 2-methoxyethanol, 2-ethoxyethanol, 1-methoxy-2-propanol, 1,2-dimethoxyethane, ethyl acetate, n-butyl acetate and ethyl 3-ethoxy-propionate.

The formulation is applied uniformly on a substrate by known coating processes, e.g. by spinning, immersion, knife coating, curtain coating, brush application, spraying and, in particular, by electrostatic spraying and reverse roll coating.

The amount applied (layer thickness) and the type of substrate used (layer substrate) depend of the desired field of application. The layer thickness is usually in the range from about 0.1 μm up to more than 30 μm, e.g. from 4 μm to 15 μm.

Another field of application for the novel process is metal coating, typically for painting metal sheets and tubes, cans or bottle caps. In this case, suitable substrates are in particular metals, such as aluminium or tinplate. Accordingly, this invention also relates to a process wherein an aluminium can is used as substrate, as well as to an aluminium can coated by the novel process.

In the novel process, UV-irradiation is usually carried out with light having a wavelength in the range of 200–600 nm. Suitable radiation includes e.g. sun light or light from artificial light sources. Light sources to be used include a great number of a very wide range of types. Suitable light sources are point sources as well as arrays of reflector lamps (lamp carpets). Typical examples are: carbon arc lamps, xenon arc lamps, mercury (medium, high and low pressure) lamps, where desired doped with metal halides (metal halide lamps), microwave-excited metal vapour lamps, excimer lamps, superactinic neon lamps, fluorescent lamps, argon filament lamps, flash bulbs, photographic flood light lamps, electron beams and X-rays. The distance between the lamp and the substrate to be irradiated can vary depending on the end use requirement and type of lamp or lamp intensity, e.g. from 2 cm to 150 cm. Laser light sources are also suitable, e.g. excimer laser. It is also possible to use laser in the visible range.

The following Examples illustrate the invention in more detail. Here as well as in the remaining description and in the patent claims, parts or percentages are by weight, unless otherwise stated.

EXAMPLE 1

A photcurable formulation is prepared from 40.9 parts of Araldite® CY 179 (cycloaliphatic diepoxide, supplied by Ciba Specialty Chemicals)

5.0 parts of Tone® 0301 (polycaprolactonetriol, chain transfer agent, supplied by UCC)

2.0 parts of dipropylene glycol 35.0 parts of R-TC2® (titanium dioxide, rutile type, supplied by Tioxide)

1.5% of (4-octyloxyphenyl)phenyliodonium hexafluoroantimonate and 0.5% of Quantacure© ITX (isopropylthioxanthone; supplied by Octel Chemicals) are incorporated into this formulation. Samples of the composition are applied to a 300 μm thick aluminium plate using a 24 μm spiral applicator. Curing is carried out by irradiation using a 120 W/cm Fusion V lamp, the sample being passed under the lamp on a belt at a speed of 10 m/min. A tack-free surface is obtained in this manner, i.e. touching the surface lightly with a finger leaves no fingerprint. The Yellowness Index of the sample according to ASTM D 1925-70 (YI) is 2.4. The sample is then postcured for 5 minutes in a circulating air oven at 180° C. The Yellowness Index is determined again and is now −1.8, showing a marked bleaching of the cured surface.

EXAMPLE 2

A photocurable formulation is prepared from 75.00 parts of Araldite® CY 179 (cycloaliphatic diepoxide, supplied by Ciba Specialty Chemicals)

15.00 parts of Araldite® GY 250 (diglycidyl ether of bisphenol A, supplied by Ciba Specialty Chemicals)

10.00 parts of Tone® 0301 (polycaprolactonetriol, chain transfer agent, supplied by UCC)

0.25 parts of Byk® 307 (agent for enhancing the surface smoothness and wetting, supplied by Byk-Mallinckrodt)

72.0 parts of R-TC2® (titanium dioxide, rutile type, supplied by Tioxide)

1.5% of (4-octyloxyphenyl)phenyliodonium hexafluoroantimonate and 0.5% of Quantacure© ITX (isopropylthioxanthone; supplied by Octel Chemicals) are incorporated in this formulation. Samples of the composition are applied to a 300 μm thick aluminium plate using a 12 μm spiral applicator. Curing is carried out by irradiation using a 120 W/cm Fusion D lamp, the sample being passed under the lamp on a belt at a speed of 25 m/min. A tack-free surface is obtained in this manner, i.e. touching the surface lightly with a finger leaves no fingerprint. The Yellowness Index of the sample according to ASTM D 1925-70 (YI) is 3.0. The sample is then postcured for 5 minutes in a circulating air oven at 180° C. The Yellowness Index is determined again and is now −1.0, showing a marked bleaching of the cured surface.

EXAMPLE 3

2.0% of (4-octyloxyphenyl)phenyliodonium hexafluorophosphate and 6.0% of Cyracure® UVI 6990*(50% mixture of triarylsulfonium hexafluorophosphate salts in propylenecarbonate, supplied by UCC) are incorporated into a formulation of Example 2. Samples thereof are applied to a 300 μm thick aluminium plate using a 12 μm spiral applicator. Curing is carried out by irradiation using a 120 W/cm Fusion V lamp, the sample being passed on a belt under the lamp at a speed of 12.5 m/min. A tack-free surface is obtained in this manner, i.e. touching the surface lightly with a finger leaves no fingerprint. The Yellowness Index of the sample according to ASTM D 1925-70 (YI) is 5.0. The sample is then postcured for 5 minutes in a circulating air oven at 180° C. The Yellowness Index is determined again and is now −2.0. showing a marked bleaching of the cured surface.

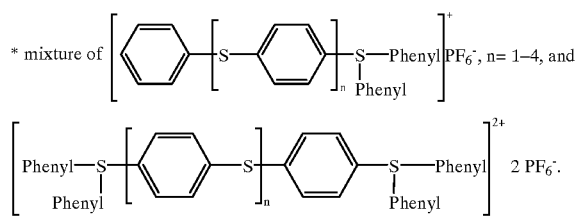

EXAMPLE 4

A photocurable formulation is prepared from
60.00 parts of Araldite® GY 250 (diglycidyl ether of bisphenol A, supplied by Ciba Specialty Chemicals)
30.00 parts of phenylglycidyl ether
10.00 parts of Tone® 0301 (polycaprolactonetriol, chain transfer agent, supplied by UCC)
0.25 parts of Byk® 307 (agent for enhancing the surface smoothness and wetting, supplied by Byk-Mallinckrodt)
72.0 parts of R-TC2® (titanium dioxide, rutile type, supplied by Tioxide)
1.5% of (4-octyloxyphenyl)phenyliodonium hexafluorophosphate and 0.5% of Quantacure® ITX (isopropylfthioxanthone; supplied by Octel Chemicals) are incorporated into this formulation. Samples of this composition are applied to a 300 μm thick aluminium plate using a 12 μm spiral applicator. Curing is carried out by irradiation using a 120 W/cm Fusion V lamp, the samples being passed on a belt under the lamp at a speed of 5 m/min. A tack-free surface is obtained in this manner, i.e. touching the surface lightly with a finger leaves no fingerprint. The Yellowness Index of the sample according to ASTM D 1925-70 (YI) is −0.3. The sample is then postcured for 5 minutes in a circulating air oven at 180° C. The Yellowness Index is determined again and is now −2.3. showing a marked bleaching of the cured surface.

EXAMPLE 5

The general procedure of Example 4 is repeated, but replacing (4-octyloxyphenyl)phenyl-iodonium hexafluorophosphate with 1.5% of (4-decylphenyl)phenyliodonium hexafluoro-phosphate.

The formulation has a Yellowness Index of −0.3 before being heat-cured and, owing to bleaching, its Yellowness Index is −2.5 after being heat-cured.

What is claimed is:

1. A curing process for cationically polymerisiable resins, wherein
a composition comprising
   (a) at least one cationically polymerisable compound,
   (b) as photoinitiator at least one iodonium salt containing an $SbF_6$, $PF_6$ or $BF_4$ anion,
   (c) one pigment, and
   (d) at least one sensitiser,
is applied to a substrate and is irradiated with light having a wavelength of 200–600 nm, which process comprises heat-treating the composition after the exposure to light, thereby producing a bleaching of the formulation.

2. A process according to claim 1, wherein the photoinitiator (b) is a compound of formula I or II

wherein
$R_1$ and $R_2$ are each independently of the other phenyl which is unsubstituted or substituted by $C_1$–$C_{24}$alkyl, $C_1$–$C_{24}$alkoxy, $NO_2$, Cl, Br, CN, $COOR_3$, $SR_3$ or

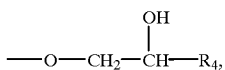

a radical

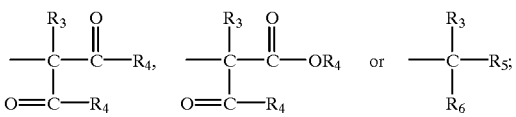

or $R_1$ and $R_2$ together are a radical

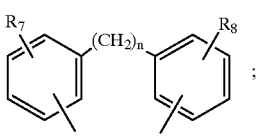

n is a number from 0 to 6;
$R_3$ is hydrogen or $C_1$–$C_{12}$alkyl;
$R_4$ is $C_1$–$C_{18}$alkyl or phenyl;
$R_5$ and $R_6$ are CN, or $R_5$ is $NO_2$ and $R_6$ is phenyl;
$R_7$ and $R_8$ are each independently of the other $C_1$–$C_{24}$alkyl, $C_1$–$C_{24}$alkoxy, $NO_2$, Cl, Br, CN, $COOR_3$, or $SR_3$; and
M is P, Sb or As.

3. A process according to claim 1, wherein the photoinitiator is a compound of formula I.

4. A process according to claim 1, wherein $R_1$ and $R_2$ are each independently of the other phenyl which is unsubstituted or substituted by $C_1$–$C_{24}$alkyl, $C_1$–$C_{24}$alkoxy, $NO_2$, Cl, Br, CN, $COOR_3$ or $SR_3$.

5. A process according to claim 4, wherein $R_1$ and $R_2$ are each independently of the other $C_1$–$C_{24}$alkyl—or $C_1$–$C_{24}$alkoxy-substituted phenyl.

6. A process according to claim 2, wherein M is P.

7. A process according to claim 3, wherein in the compound of formula I $R_1$ and $R_2$ are identical.

8. A process according to claim 1, wherein the sensitiser (d) is a compound selected from the group consisting of anthracenes, xanthones, benzophenones and thioxanthones.

9. A process according to claim 1, wherein component (c) in the composition comprises a white pigment.

10. A process according to claim 1, wherein 5% to 60% of pigment (c) are used in the polymerisable composition.

11. A process according to claim 1, wherein the photoinitiator (b) is a compound of formula I, wherein $R_1$ and $R_2$ are $C_1$–$C_{12}$alkyl- or $C_1$–$C_{12}$alkoxy-substituted phenyl, and M is Sb or P; the pigment (c) is a white pigment; and the sensitiser (d) is a thioxanthone or a triarylsulfonium salt.

12. A process according to claim 1, which comprises carrying out the postcure in the temperature range from 100° C. to 250° C.

13. A process according to claim 1, wherein component (a) is a cycloaliphatic epoxide, or an epoxide based on bisphenol A.

14. A process for coating substrates on both sides, wherein first one surface of the substrate is coated with a UV-curable coating comprising (a) at least one cationically polymerisable compound, (b) as photoinitiator at least one iodonium salt containing one $SbF_6$, $PF_6$ or $BF_4$ anion, (c) one pigment, and (d) at least one sensitiser, and is then irradiated with light having a wavelength of 200–600 nm, and then a heatcurable coating is applied to the second surface which is subsequently heat cured, the heat curing at the same time producing a bleaching of the radiation cured coating.

15. A process according to claim 1, wherein the substrate is an aluminium can.

16. An aluminium can, which has been coated by the process claimed in claim 1.

17. A process according to claim 1, wherein the sensitiser (d) is isopropylthioxanthone.

* * * * *